(12) United States Patent
Beigel et al.

(10) Patent No.: US 7,031,182 B2
(45) Date of Patent: *Apr. 18, 2006

(54) RECTIFYING CHARGE STORAGE MEMORY CIRCUIT

(76) Inventors: Michael L. Beigel, 308 Via Julita, Encinitas, CA (US) 92024; John Leipper, 308 Via Julita, Encinitas, CA (US) 92024

( * ) Notice: Subject to any disclaimer, the term of this patent is extended or adjusted under 35 U.S.C. 154(b) by 194 days.

This patent is subject to a terminal disclaimer.

(21) Appl. No.: 10/895,429

(22) Filed: Jul. 1, 2003

(65) Prior Publication Data

US 2005/0041455 A1  Feb. 24, 2005

Related U.S. Application Data

(63) Continuation-in-part of application No. 10/155,518, filed on May 24, 2002, now Pat. No. 6,642,782, which is a continuation of application No. 09/723,897, filed on Nov. 28, 2000, now Pat. No. 6,414,543.

(51) Int. Cl.
*G11C 7/00* (2006.01)
(52) U.S. Cl. ...................... 365/149; 365/105
(58) Field of Classification Search .............. 365/149, 365/105, 175, 103
See application file for complete search history.

(56) References Cited

U.S. PATENT DOCUMENTS

| | | | |
|---|---|---|---|
| 3,813,927 A | 6/1974 | Furgason | |
| 3,840,800 A | 10/1974 | Laupman | |
| 4,333,072 A | 6/1982 | Beigel | |
| 4,920,513 A * | 4/1990 | Takeshita et al. | 365/175 |
| 5,691,935 A * | 11/1997 | Douglass | 365/149 |
| 5,731,691 A | 3/1998 | Noto | |
| 5,822,240 A * | 10/1998 | Yoo | 365/145 |
| 5,854,117 A | 12/1998 | Huisman et al. | |
| 5,915,197 A | 6/1999 | Yamanaka et al. | |
| 5,973,598 A | 10/1999 | Beigel | |
| 6,037,718 A | 3/2000 | Nagami | |
| 6,087,196 A | 7/2000 | Sturm et al. | |
| 6,208,551 B1 * | 3/2001 | Jaouen et al. | 365/149 |
| 6,414,543 B1 | 7/2002 | Beigel et al. | |

* cited by examiner

*Primary Examiner*—Vu A. Le
(74) *Attorney, Agent, or Firm*—Kelly Lowry & Kelley, LLP (57) ABSTRACT

A composite rectifying charge storage device, consisting of a rectifier and capacitor which share common elements, is provided in a memory circuit or memory cell. In one form, the memory cell is adapted for alternative operation as a random access memory (RAM) or as a read only memory (ROM).

33 Claims, 5 Drawing Sheets

RECTIFYING CHARGE STORAGE MEMORY CIRCUIT

This is a continuation-in-part of U.S. Ser. No. 10/155,518, filed May 24, 2002 now U.S. Pat No. 6,642,782, and published as Publication No. US 2002/0140500 A1 on Oct. 3, 2002, which in turn is a continuation of U.S. Ser. No. 09/723,897, filed Nov. 28, 2000, and now issued as U.S. Pat. No. 6,414,543 on Jul. 2, 2002.

BACKGROUND OF THE INVENTION

This invention relates generally to a composite rectifying charge storage device of the type having a rectifier and capacitor which share common elements, as described in U.S. Pat. No. 6,414,543 and U.S. Publication US 2002/0140500 A1, and related circuit applications for using the composite device. More particularly, this invention relates to the composite rectifying charge storage device incorporated in a memory circuit or memory cell. In one preferred form, the memory cell is adapted for alternative operation as a random access memory (RAM), or as a read only memory (ROM).

U.S. Pat. No. 6,414,543 and U.S. Publication US 2002/0140500 A1, which are incorporated by reference herein, disclose embodiments for a composite rectifying charge storage element and related electronic circuits suitable for fabrication on various substrates, including flexible substrates, by various means including printing or other deposition techniques using organic conductors, semiconductors and insulators and other electronic materials suitable for deposition and use in electronic circuits. This rectifying charge storage element is disclosed for use as a power supply that extracts DC power (voltage and current) sufficient to power an electronic device from an AC input signal. The AC input signal may be derived from an inductive, capacitive, or L-C resonant circuit coupled to external AC electromagnetic field or electrostatic AC field. The electronic circuit thus powered may comprise a radio frequency identification (RFID) circuit.

In this regard, most electronic circuits require a source of DC voltage with sufficient current output to power the circuit elements. Many of these circuits derive DC power by rectifying and filtering an AC power input signal. Often, the AC signal is provided to the circuitry by electromagnetic coupling. For example, a passive RFID tag system must be capable of receiving power from an RFID reader to the RFID tag via an inductive (H-field) or electric field (E-field) coupling, and transmitting data from the tag to the reader also via inductive or electric field coupling. The activation field frequency for typical RFID devices may range from less than about 100 kHz up to more than about 30 MHz if inductive or capacitive coupling is utilized, and up to the UHF and microwave region if electric field RF antenna coupling is used. In current industry practice, operating power to a passive RFID tag or other electronic circuit is derived by utilizing a rectifier device and a charge-storage device, typically a rectifier diode or combination of diodes connected to a charge storage capacitor or combination of capacitors. In the past, these elements have been implemented as separate components within a discrete circuit or silicon integrated circuit. See, for example, U.S. Pat. No. 4,333,072.

Recent advancements in circuitry manufacturing processes, applicable to RFID tag and similar electronic circuit systems, have enabled the production of electronic circuits on flexible substrates using thin film materials such as organic and polymer semiconductors and other substances that can be applied by techniques such as ink jet printing. A primary objective is to produce electronic devices that have operating characteristics similar to discrete or integrated silicon circuit technology sufficient to operate certain types of circuits while approaching the economy of printing processes. See, for example, U.S. Pat. Nos. 5,973,598 and 6,087,196.

The rectifying charge storage device disclosed in the above-referenced U.S. Pat. No. 6,414,543 and U.S. Publication US 2002/0140500 A1 incorporates a rectifier component such as a rectifying diode in combination with a charge storage component such as a capacitor, wherein these components share one or more common elements resulting in a composite device that is particularly suited for economical manufacture as by printing processes or the like. In addition, the composite device in especially suited for support on a flexible substrate which may comprise an integral portion of the device. Moreover, the supporting substrate may also comprise an electrically operative portion of the device. However, this rectifying charge storage device has alternative uses in electronic circuitry other than as a power supply device.

SUMMARY OF THE INVENTION

In accordance with the invention, an improved composite rectifying charge storage device is provided of the type shown and described in U.S. Pat. No. 6,414,543 and U.S. Publication US 2002/0140500 A1, wherein the composite device is incorporated into a memory circuit or memory cell for storing binary information or the like. In one form, the composite device is combined with a gate element such as a gate field-effect transistor for alternative operation as a random access memory (RAM) or as a read only memory (ROM), thereby providing alternative volatile and nonvolatile memory capability in a single circuit arrangement. Use of the composite device in the memory circuit or cell beneficially results in a reduced or more compact circuit footprint area.

The composite rectifying charge storage device includes a rectifier such as a diode and a capacitor coupled to a common conductor. The capacitor is defined by the common conductor and a second conductor with a dielectric material defining a dielectric gap therebetween. In one form, the common conductor may comprise the cathode or anode connection to the diode. In another form, the diode function is provided by a semiconductor material which also forms the dielectric material disposed between the capacitor conductors. In either configuration, the device may be formed as by ink jet printing or the like onto a substrate which may comprise a flexible substrate. The substrate may be provided as a separate component having the rectifying charge storage device formed or mounted thereon. Alternately, the substrate can be formed integrally with the rectifying charge storage device, for example, by integrating the substrate with the dielectric material.

An array of composite devices are provided in a memory circuit or memory cell matrix including a plurality of individual memory cells each separately addressable by means of a corresponding intersecting array of so-called word lines and bit lines. Each memory cell within the matrix incorporates a composite rectifying charge storage device coupled between the associated word and bit lines. An additional array of so-called state lines may be connected to the composite devices for programming the state of the diode and/or capacitor components of the composite device within each memory cell.

In one preferred form for alternative operation as a random access memory (RAM) or a read only memory (ROM) circuit, the composite rectifying charge storage device within each memory cell of the memory matrix is connected with the second conductor of the capacitor component coupled to a gate transistor. The opposite, common conductor of the capacitor component is coupled through the diode component in a reverse-bias orientation to a suitable ground point. A RAM enable transistor provides a bypass connection for coupling the common conductor to a suitable ground point in bypass relation to the diode component.

In a random access memory (RAM) mode of operation, the RAM enable transistor is switched to a conductive state for coupling the common conductor of the capacitor component to the ground point, thereby bypassing the diode component of the composite device. In this mode, the gate transistor can also be switched to a conductive state upon input thereto of an appropriate gate signal on the associated word line of the memory matrix, thereby coupling the second conductor of the capacitor component to an input signal on the corresponding bit line for resultant storage of a charge representing a "1" in binary code. Conversely, in the absence of an input signal on the associated bit line, no charge is stored thereby representing a "0" in binary code. The presence or absence of such stored charge can be monitored by means of standard bit line sensing devices, and repeatedly refreshed as appropriate.

In a read only memory (ROM) mode of operation, the diode component is rendered conductive or nonconductive by the application of a suitable signal of sufficient voltage, current, frequency, or by other suitable means, thereby breaking the diode component to configure the memory circuit or cell for representing a "1" or "0" in binary code. Upon subsequent switching of the gate transistor to a conductive state, standard bit line sensing devices will determine alternative states in accordance with the conductive or nonconductive state of the diode component, and thereby provide an indication of a "1" or "0" in binary code. During such bit line sensing, the RAM enable transistor is maintained in a nonconductive state.

In a further preferred form of the invention, the composite rectifying charge storage device may incorporate the RAM enable transistor as an integrated component, thereby resulting in a further reduced and more compact circuit footprint area.

Other features and advantage of the present invention will become more apparent from the following detailed description, taken in conjunction with the accompanying drawings which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

As shown in the exemplary drawings, an improved composite rectifying charge storage device referred to generally in FIGS. 1–10 by the reference numeral 10 provided for use in a memory circuit or cell 50 (FIG. 4) for storing binary information or the like within a memory matrix including a large plurality of memory cells. The multiple memory cells are individually defined and separately addressable by means of an intersecting array of so-called word lines 56 and bit lines 58, with the composite device 10 within each memory cell 50 coupled between the associated word and bit lines 56, 58. In one preferred form, the composite device 10 is combined with a gate element such as a gate transistor 52 for combined or alternative operation as a random access memory (RAM) and/or as a read only memory (ROM), thereby providing both volatile and nonvolatile memory capability in a single circuit arrangement. Use of the composite device 10 in the memory circuit or cell 50 beneficially results in a reduced or more compact circuit footprint area.

The improved rectifying charge storage device 10 corresponds generally with the device shown and described in parent U.S. Pat. No. 6,414,543 and in copending U.S. Publication US 2002/0140500 A1, both of which are incorporated by reference herein. In this regard, as viewed in FIG. 1 with respect to one preferred form for use in a power supply application, the illustrative rectifying charge storage device 10 generally includes a diode rectifier 12 and a capacitor 14 which share common elements. The diode 12 includes a conductor 16 and a semiconductor 18. A common conductor 20 between the diode 12 and capacitor 14 is superimposed on a dielectric component 22 of the capacitor 14 which, in turn, is mounted on a second or ground conductor 24.

Figure 1:
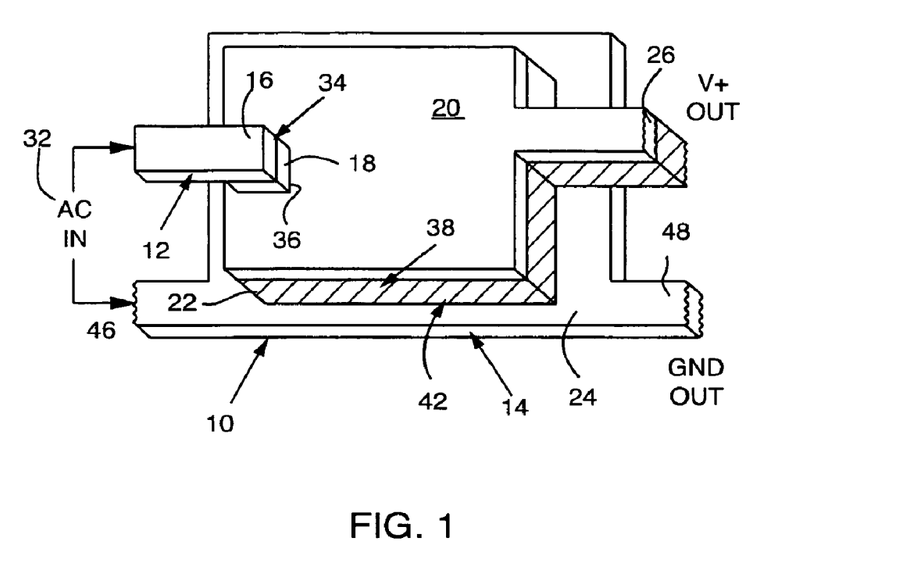
FIG. 1 is a somewhat schematic perspective view illustrating a composite rectifying charge storage device for use in the invention.
Figure 2:
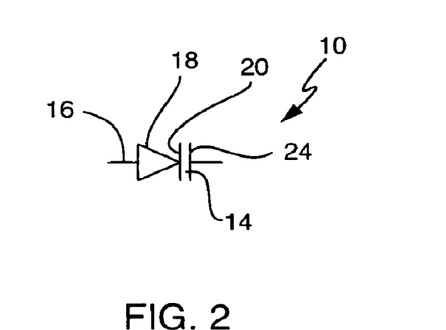
FIG. 2 is a circuit diagram illustrating the composite device of FIG. 1 in one form.
Figure 3:
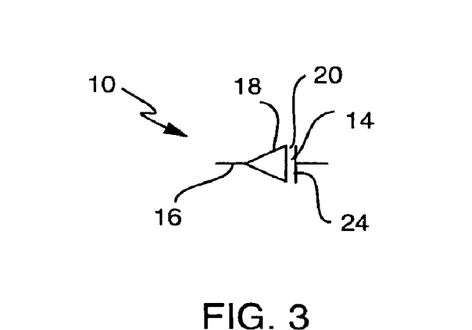
FIG. 3 is a circuit diagram illustrating the composite device of FIG. 1 in an alternative form.

The conductor 16 is electrically connected to one terminal 30 of a suitable electrical signal source 32, and is electrically connected to one surface of the semiconductor 18 at a surface interface 34. The opposite surface of the semiconductor 18 is electrically connected to the common conductor 20 at a surface interface 36. The common conductor 20 is connected to the dielectric component 22 at a surface interface 38, and the conductor 24 is connected to the dielectric component 22 at a surface interface 42. The conductor 24 is connected to a second terminal 46 of the electrical signal source 32 and also serves as the ground output terminal 48.

Rectification takes place between the conductor 16, the semiconductor 18, and the common conductor 20 through the interfaces 34 and 36. Charge storage takes place across the capacitor 14, between the capacitor plates defined by the common conductor 20 and the second conductor 24 with the dielectric component 22 disposed therebetween. The surface area of the rectifying component and 16, 34, 18, 36, and 20 interfaces may be minimized to reduce internal parasitic capacitor characteristics inherent in rectification. The surface area of the capacitive component interface provided by the common conductor 20 may be maximized to increase DC charge storage capacity. In this illustrative power supply application, the common conductor 20 provides the DC power output at a junction 26.

The diode component may be fabricated from various materials, including inorganic semiconductor nanocrystals such as CdSe, InP, and others. Furthermore, conjugated polymers may be used, such as poly(phenylene-vinylene) (PPV), its derivatives and co-polymers (such as MEH-PPV (poly(2-methoxy, 5-(2'-ethyl-hexoxy)-p-phenylene vinylene))); polyfluorene (PF), its derivatives and co-polymers; polyparaphenylene (PPP), its derivatives and co-polymers; polythiophene (PT), its derivatives and co-polymers; and others.

The rectifying function of the diode 12 is implemented through the conductor 16 which serves as the anode and the common conductor 20 which serves as the cathode. The rectifying character of an organic or a polymeric diode usually requires different conductors with different work functions for the anode and for the cathode. Organic and polymeric semiconductors are usually regarded as semiconductors with low doping concentration (usually in the range of $\sim 10^{13}$ cm$^{-3}$), hence the theory of p-n junction commonly used inorganic semiconductor diodes is not applicable here.

For inorganic diodes, metal electrodes for the anode and cathode can be the same material with ohmic contacts to the p-type and n-type semiconductor, respectively. The rectifying behavior is from the p-n junction.

For organic semiconductors, the relative position of the work functions (or the energy level) of the metal electrodes to the energy levels of the conduction band and valence band of the organic semiconductor determines the rectifying behavior. The choice of anode hence is preferentially to be high work function metals such as gold, nickel, and their alloys. Alternatively, some metal oxides, including but not limited to indium tin-oxide, indium oxide, are also candidates for the anode material. For the cathode, the choice is preferentially low work function metals, including but not limited to calcium, lithium, magnesium, and others. Recently, the metal alloys consisting of a small amount of low work function metals, such as aluminum:lithium 3% alloy and 97% Al:LiF bilayer electrode, have become alternatives for the choice of cathode material.

In the case where the conductor 16 is formed from a relatively high work function metal such as a thin layer of aluminum or gold, a layer of low work function material is used for the common conductor 20. In this configuration, the conductor 16 comprises the anode connection to the semiconductor or diode component 18, with the common conductor 20 comprising the cathode connection to yield a composite device 10 having an electrical schematic as viewed in FIG. 2. Conversely, when the conductor 16 is formed from a low work function material, the common conductor 20 should be formed from a comparatively high work function metal such as aluminum or gold. In this latter configuration, the common conductor 20 comprises the anode connection for the semiconductor 18, and conductor 16 comprises the cathode connection, resulting in a composite device having an electrical schematic as viewed in FIG. 3.

Alternative organic semiconductors, referred to as high performance organic semiconductor devices, are shown and described in copending U.S. Ser. No. 10/218,141, filed Aug. 12, 2002, and incorporated by reference herein.

The materials for the capacitor dielectric 22 should be insulating materials, preferentially with a high dielectric constant to enhance its capacity. The structure of the capacitor 14 should provide a larger area compared to the diode. The dielectric 22 may be an organic or polymeric or inorganic insulator with reasonable dielectric constant. It should be large enough to hold enough charge, and it should also be small enough such that the device 10 has a fast response time. Currently, polymer materials such as polystyrene, polyethylene, and polycarbonate are ideal candidates. The dielectric 22 should be flexible where the other components of the device 10 are flexible.

In alternative configurations as shown and described in more detail in parent U.S. Pat. No. 6,414,543 and in copending U.S. Publication US 2002/0140500 A1, the composite device 10 may be mounted onto a suitable substrate (not shown in FIG. 1) which may comprise a flexible substrate. Or, if desired, the substrate which may be flexible can be formed by a portion of the composite device 10, such as by incorporating the substrate directly into the dielectric component 22. Alternatively, or additionally, the dielectric component 22 may be defined by a combination semiconductor and dielectric layer for performing the dual functions of rectification and insulation between the capacitor plates. Any or all of these features may be incorporated into a planar array, and may further include capacitor plates having an interdigitated configuration.

Figure 4:
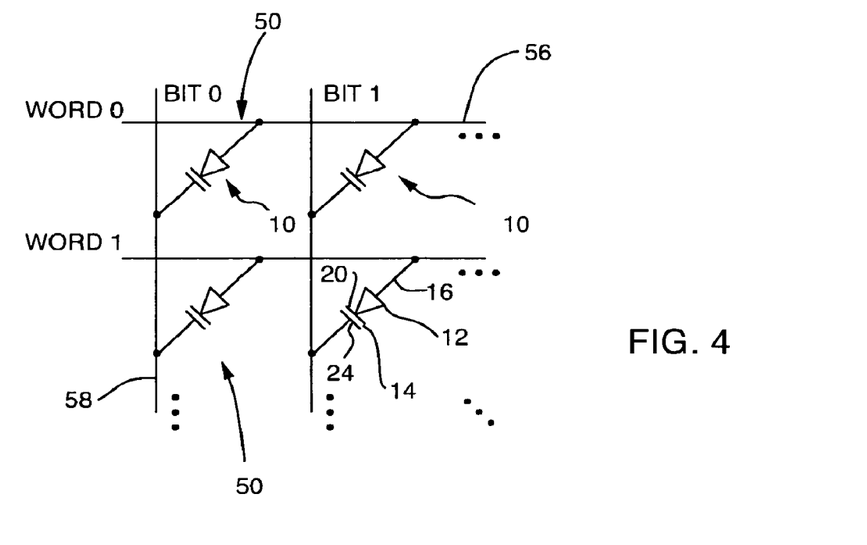
FIG. 4 is a 2-dimensional matrix cell diagram illustrating use of the composite device in an array or matrix of memory cells, in accordance with one preferred form of the invention.
Figure 5:
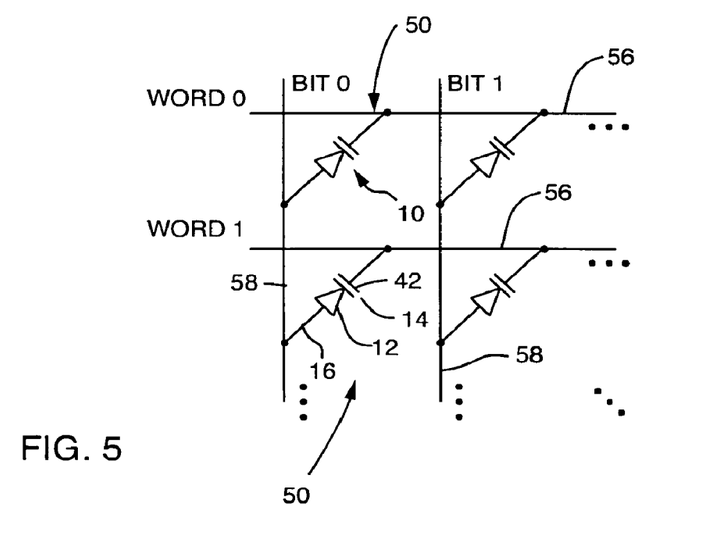
FIG. 5 is a 2-dimensional matrix cell diagram similar to FIG. 4, but depicting the composite device in accordance with an alternative preferred form of the invention.

In accordance with the present invention, and as viewed in FIG. 4 with respect to one preferred form, the composite rectifying charge storage device 10 is used in the memory circuit or cell 50 of a memory matrix for storing binary information. In general, each composite device 10 including the diode component 12 and associated capacitor component 14 is connected between the corresponding word line 56 and bit line 58. FIG. 4 shows the conductor 16 at the anode side of the diode component 12 coupled to the word line 56, and second conductor 24 of the capacitor component 14 coupled to the bit line 58. FIG. 5 shows a similar arrangement but wherein the conductor 16 at the anode side of the diode component is coupled to the bit line 58, and the second conductor 24 of the capacitor component is coupled to the word line 56. Persons skilled in the art will recognize that the polarity of the diode component 12 as shown in FIGS. 4–5 may be reversed.

Figures 6, 7, 8, 9:
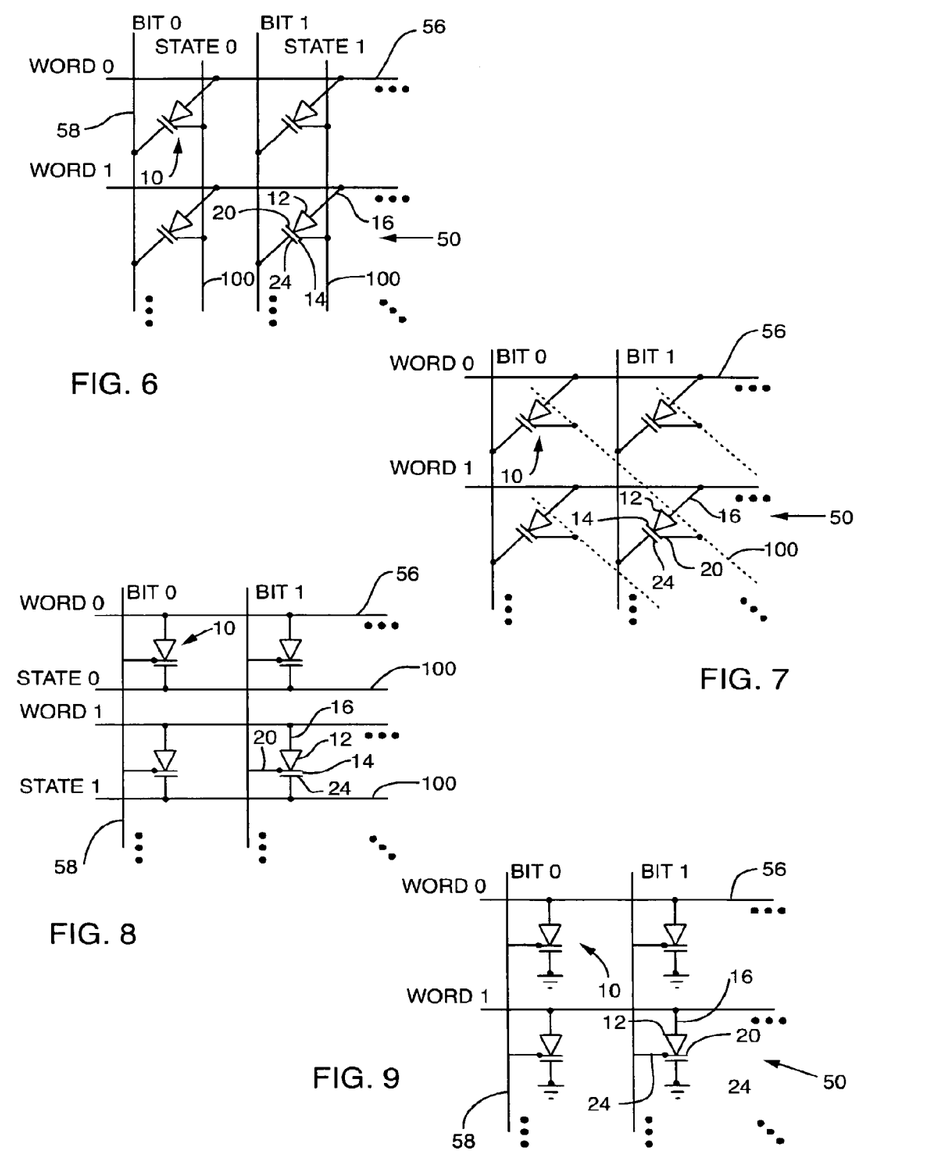
FIG. 6 is another 3-dimensional matrix cell diagram similar to FIG. 4, but showing still another alternative preferred form of the invention.
FIG. 7 is a 3-dimensional matrix cell diagram similar to FIG. 6, and illustrating the composite device in accordance is a modified preferred arrangement.
FIG. 8 is another 3-dimensional matrix cell diagram similar to FIG. 6, and showing an alternative embodiment of the invention.
FIG. 9 is a further 3-dimensional matrix cell diagram similar to FIG. 6, and depicting the composite device in accordance with a further alternative preferred form of the invention.

FIGS. 6–9 illustrate further alternative arrangements incorporating a plurality of the composite rectifying charge storage devices 10 into a memory matrix including a plurality of memory cells 50. In each arrangement, the composite device 10 within each memory cell 50 is coupled between the associated word line 56 and bit line 58. FIG. 6 depicts an arrangement similar to FIG. 4, but wherein a each column of memory cells 50 is further associated with a corresponding state line 100 for programming the composite devices 10 within that column. FIG. 6 shows the state line 100 coupled to the common conductor 20 of each composite device 10, wherein the state line 100 provides an input signal which may be used, for example, for controlling the conductive or nonconductive state of the diode component 12 or the change or operating condition of the capacitor component 14. FIG. 7 shows a similar arrangement but wherein the state lines 100 are each coupled to a diagonal line of memory cells 50. In FIG. 8, another similar arrangement is depicted, but wherein the state lines are connected to rows of the memory cells 50 by connection to the second conductor 24 of each capacitor component 14, with the common conductor 20 connected to the associated bit line 58. A further variation is illustrated in FIG. 9, with the common conductor 20 of each composite device 10 coupled to the associated bit line 58. In this configuration as shown, the second conductor 24 of each composite device 10 is coupled to a suitable ground point.

It will be appreciated that the arrangements depicted in FIGS. 6–10 are illustrative, and that a variety of further variations such as reversed orientation of the device 10 or polarity reversal of the diode component 12 thereof may be used.

Figure 10:
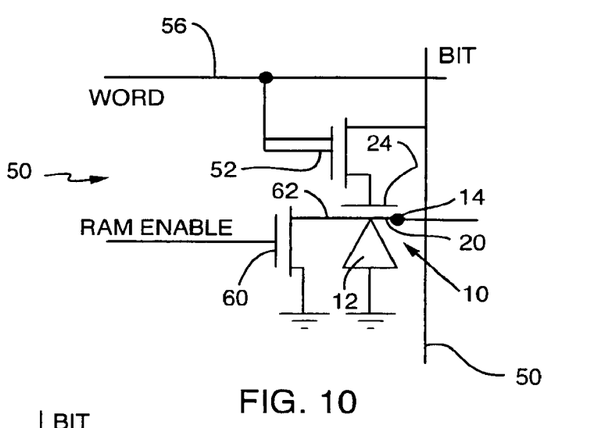
FIG. 10 is a schematic circuit diagram illustrating use of the composite device in a memory circuit or cell.

In one preferred form of the invention as viewed in FIG. 10, the composite device 10 is combined with a gate element such as a gate transistor 52 for alternative operation as a random access memory (RAM) or as a read only memory (ROM), thereby providing alternative volatile and nonvolatile memory capability in a single circuit arrangement. More particularly, as shown, the composite device 10 including the capacitor component 14 and diode component 12 is combined with a conventional gate element such as the gate transistor 52 responsive to a gate signal on the word line 56 for coupling the composite device with the bit line 58 of the memory matrix. A second gate element referred to in FIG. 10 as a RAM enable transistor 60 is also provided for setting the memory circuit or cell 50 in a random access memory (RAM) mode or alternately in a read only memory (ROM) mode. Accordingly, the circuit arrangement provides both RAM and ROM capability for respective volatile and nonvolatile memory storage in a single device. In the ROM mode, nonvolatile memory storage can be reversible or irreversible.

More particularly, with reference to the illustrative embodiment shown in FIG. 10, the composite device 10 is connected in the memory circuit or cell 50 of the memory matrix with the second conductor 24 of the capacitor component 14 coupled to the gate transistor 52. Specifically, this second conductor or electrode 24 is coupled via the source and drain junctions of the gate transistor 52 to the matrix bit line 58, upon input of a logical high or gate signal from the matrix word line 56 to the gate junction of the gate transistor 52. The opposite, common conductor 20 or electrode of the capacitor component 14 is coupled through the diode component 12 oriented in a reverse-bias configuration to a suitable ground point. The common conductor 20 is also coupled to a suitable ground point via a bypass path 62 including the RAM enable transistor 60. Specifically, the common conductor 20 is coupled via the bypass path 62 through the source and drain junctions of the RAM enable transistor 60 to the ground point, upon input of a logical high or gate signal to the gate junction of the RAM enable transistor 60.

In a random access memory (RAM) mode of operation, the RAM enable transistor 60 is switched from a normal nonconductive state to an active or conductive state for coupling the common conductor 20 of the capacitor component 14 to the ground point, thereby bypassing the diode component 12 of the composite device 10. In this mode, the gate transistor 52 can also be switched from a normal nonconductive state to a conductive state upon input thereto of the appropriate gate signal on the associated word line 56 of the memory matrix, thereby coupling the second conductor 24 of the capacitor component 14 to an input signal from the corresponding bit line 58 of the memory matrix. As a result, a charge which may represent a "1" in binary code is stored by the capacitor component 14. Conversely, in the absence of an input signal on the associated bit line 58, no charge is stored by the capacitor component 14 wherein this absence of stored charge may represent a "0" in binary code. The presence or absence of such stored charge can be monitored by means of standard bit line sensing devices, and repeatedly refreshed as appropriate.

In a read only memory (ROM) mode of operation, the diode component 12 is rendered conductive or nonconductive by the application of a suitable signal of sufficient voltage, current, frequency, or by other suitable means, thereby breaking the diode component to configure the memory circuit or cell for representing a "1" or "0" in binary code. Upon subsequent switching of the gate transistor 52 to a conductive state, standard bit line sensing devices will determine the alternative states of the memory cell 50 in accordance with the conductive or nonconductive state of the diode component 12, and thereby provide an indication of a "1" or "0" in binary code. During such bit line sensing, the RAM enable transistor 60 is normally maintained in a nonconductive state.

More particularly, with continued reference to FIG. 10, the diode component 12 can be switched or broken to a nonvolatile state, such as an open circuit condition or a closed circuit condition, in accordance with the bit line sensing technique to be described in more detail. Breaking of the diode component 12 occurs by connecting a suitable set signal thereto, wherein this set signal may be represented by a particular voltage, current, frequency, or other suitable means. Breaking of the diode component 12 may be irreversible and thus permanent, or it can be reversible thereby permitting periodic reprogramming of the memory circuit 50. One exemplary reversible diode component comprises a reversible device such as an organic bistable device of the type shown and described in *Organic Bistable Light Emitting Devices,* Ma et al, Applied Physics Letters, Vol. 80, No. 5, pp. 362–364, 2002, and *Organic Electrical Bistable Devices and Rewritable Memory Cells,* L. Ma et al, Applied Physics Letters, Vol. 80, No. 6, pp. 2997–2999, 2002, both of which are incorporated by reference herein. See also PCT Publication No. WO 02/37500 A1, which is also incorporated by reference herein.

In accordance with one bit line sensing method, the diode component 12 is broken as described to provide an open circuit or nonconductive state. With the RAM enable transistor 60 also in a nonconductive state, the bit line sensing apparatus will not detect current flow through the open circuit diode component 12 in response to activation of the gate transistor 52 by the appropriate gate signal on the word line 56. This absence of current flow may represent a "0" in binary code. Conversely, in the absence of breaking the diode component 12, current will flow therethrough upon activation of the gate transistor 52. Specifically, the current flow through the unbroken diode component 12 will force the bit line 58 negative (in the illustrative example) relative to the ground point, wherein this condition is detected by the bit line sensing apparatus and may represent a "1" in binary code.

In an alternative ROM configuration, the RAM enable transistor 60 associated with each memory circuit or cell 50 in the memory matrix may be activated to cause the associated capacitor component 14 to store a charge representative, for example, of a "1" in binary code. Thereafter, the RAM enable transistor 60 is deactivated. The bit line sensing apparatus can then be configured to detect the broken or unbroken state of the diode component 12. More particularly, an unbroken diode component 12 will be forward-biased by the stored charge and will conduct current which can be monitored and detected by the bit line sensing apparatus. Conversely, in this case a broken diode in open circuit mode will not conduct current. A cell 50 having an unbroken or functioning diode component 12 will produce a larger charge pulse in comparison with a cell having a broken or open circuit diode component, whereby these states may respectively represent a "1" and a "0" in binary code.

Alternately, the broken diode component 12 may be set in a closed circuit state. The bit line sensing apparatus can again distinguish between a circuit having a broken versus an unbroken diode component, for correspondingly distinguishing between alternative states representing a "1" and a "0" in binary code.

Figure 11:
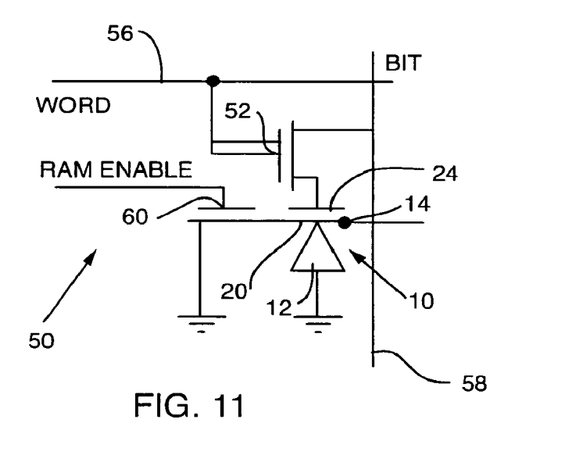
FIG. 11 is a schematic circuit diagram similar to FIG. 10, but depicting an alternative preferred form of the invention with the composite device further incorporating an integrated RAM enable transistor.

FIG. 11 depicts an alternative preferred embodiment of the invention, corresponding functionally to the embodiment shown and described herein with respect to FIG. 10, but wherein the composite device 10 further incorporates the RAM enable transistor 60 as an integrated element. In this regard, for convenience and brevity of description, functional components depicted in FIG. 11 which conform to those shown and described in FIG. 10 are identified by common reference numerals. In this embodiment, the common conductor 20 of the composite device 10 is also shared by the drain terminal of the RAM enable transistor 60, whereby the bypass path or conductor 62 shown in FIG. 10 connected between the common conductor 20 and the RAM enable transistor 60 is eliminated. This configuration, shown schematically in FIG. 12, beneficially provides a further reduction in the footprint area of the memory circuit 50.

Figure 12:
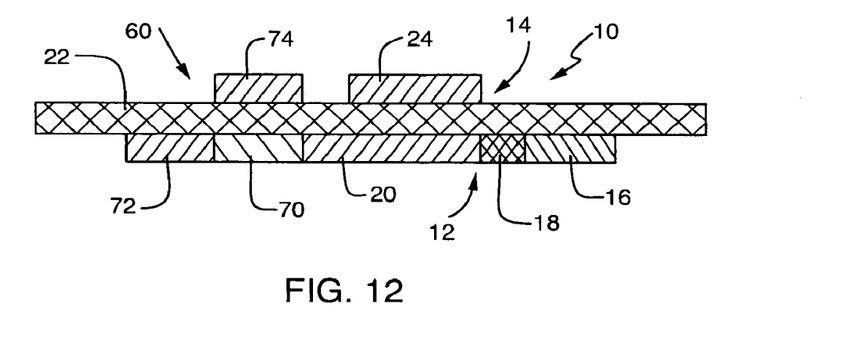
FIG. 12 is a fragmented sectional view showing the composite device with integrated RAM enable transistor of FIG. 11.

More particularly, as viewed in FIG. 12, the composite device 10 includes the dielectric component 22 which may be flexible and function further as a substrate for the device. The conductors 24 and 20 are formed on opposite sides of the dielectric 22, and cooperate therewith to define the capacitor component 14. The common conductor 20 is electrically connected to a semiconductor 18 of suitable organic or polymer material, which is electrically connected in turn with an input conductor 16 also carried by the dielectric 22 to form the diode component 12 of the composite device. The materials used to form the input conductor 16 and the common conductor 20 will normally exhibit different work functions.

The RAM enable transistor 60 is also carried by the dielectric 22, to include a composite drain terminal integrated with the common conductor 20. An organic semiconductor 70 is electrically connected to the common conductor 20 and acts as a channel region for the transistor for transfer of electrons between the drain terminal/common conductor 20 and a source terminal 72 of the same work function material. A gate terminal 74 for the transistor 60 is carried by the dielectric 22 in opposition to the transistor semiconductor 70.

In this arrangement as viewed in FIG. 12, the source terminal 72, the gate terminal 74, the capacitor electrode 24, and the common electrode 20 connect to external devices. The transistor structure corresponds to that shown and described in U.S. Pat. No. 6,278,127, which is incorporated by reference herein.

Figure 13:
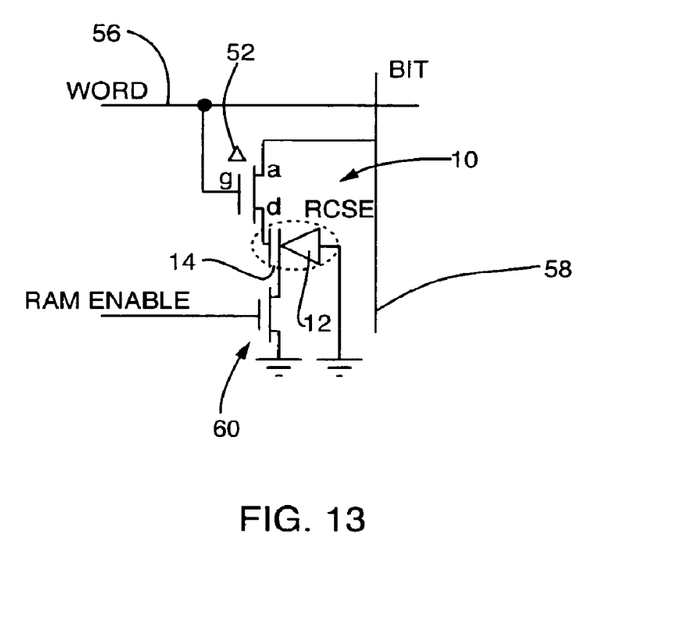
FIG. 13 is a schematic circuit diagram similar to FIG. 11, but showing another alternative preferred form of the invention with the composite device incorporating integrated RAM enable and gate transistors.
Figure 14:
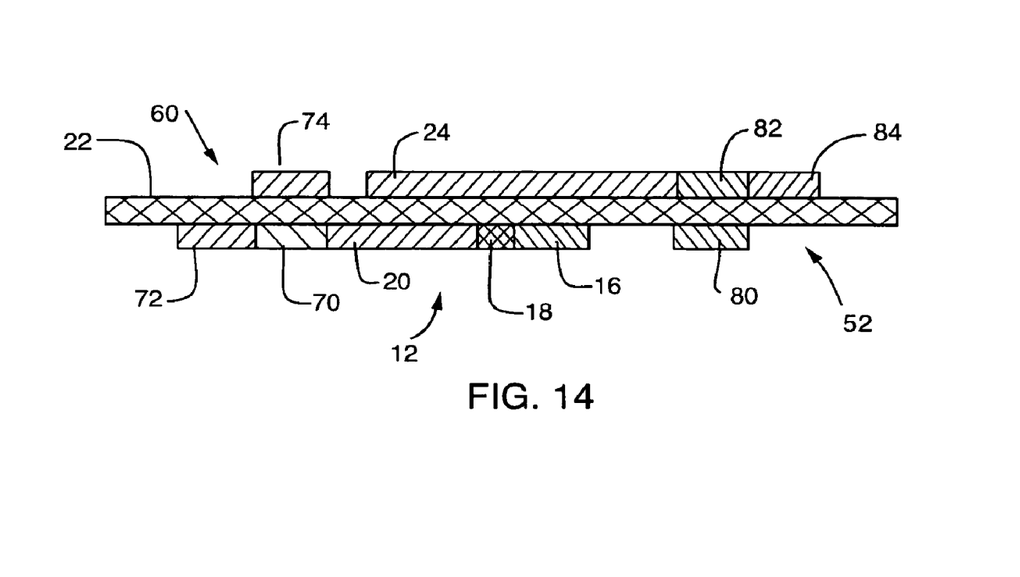
FIG. 14 is a fragmented sectional view showing the composite device with integrated RAM enable and gate transistors.

FIGS. 13–14 illustrate a further variation similar to FIGS. 11–12, but wherein the composite device 10 incorporates both the RAM enable transistor 60 and the gate transistor 52 as common elements. In this configuration as shown schematically in FIG. 14, the combination of the composite device 10 and RAM enable transistor 60 may correspond to the configuration shown in FIG. 12, but wherein the second conductor 24 is extended at one side of the dielectric material 22 for electrical connection to the gate transistor 52. As shown, the gate transistor 52 comprises a gate terminal 80 carried by the dielectric material in opposition to an organic semiconductor 82 which is associated with the second conductor 24 and acts as a channel region for the transistor 52 for transfer of electrons between a drain terminal shared by the conductor 24 and a source terminal 84 of the same work function material. In this configuration, the overall footprint defined by the memory circuit is further reduced.

A variety of further modifications and improvements in and to the composite rectifying charge storage device connected in a circuit with an antenna will be apparent to persons skilled in the art. By way of example, it will be recognized and understood that the composite device 10 illustrated in FIG. 1, for use in the memory circuit 50, may be constructed in accordance with any one of the embodiments shown and described in the above-referenced parent U.S. Pat. No. 6,414,543 and copending U.S. Publication US 2002/0140500 A1.

The invention claimed is:

1. A memory circuit, comprising;
   at least one memory cell including a word line and a bit line; and
   a composite rectifying charge storage device within said memory cell and coupled between said word line and said bit line;
   said composite rectifying charge storage device comprising a rectifier component fabricated with a common conductor forming a side of the rectifier component, and a capacitor component fabricated as a single unitary structure with the rectifier component such that the capacitor component incorporates the common conductor of the rectifier component as a side of the capacitor component, the capacitor component to receive rectified current from the rectifier component over the common conductor.

2. The memory circuit of claim 1, wherein said at least one memory cell comprises a matrix of memory cells each coupled to a respective pair of word and bit lines and each having a composite rectifying charge storage device therein.

3. The memory circuit of claim 1, wherein said rectifier component is coupled to said word line and said capacitor component is coupled to said bit line.

4. The memory circuit of claim 1, wherein said rectifier component is coupled to said bit line and said capacitor component is coupled to said word line.

5. The memory circuit of claim 1, wherein said rectifier component comprises a diode component.

6. The memory circuit of claim 5, wherein said diode component is forward-bias oriented relative to said capacitor component.

7. The memory circuit of claim 5, wherein said diode component is reverse-bias oriented relative to said capacitor component.

8. The memory circuit of claim 5, wherein said at least one memory cell further includes a state line for programming said diode component in a selected one of substantially conductive and substantially nonconductive states.

9. The memory circuit of claim 1, wherein said capacitor component comprises said common conductor, a second conductor, and a dielectric material disposed therebetween.

10. The memory circuit of claim 9, wherein said common conductor is coupled to one of said word line and said bit line, and said second conductor is coupled to ground.

11. The memory circuit of claim 9, wherein said at least one memory cell further includes a state line coupled to one of said common conductor and said second conductor.

12. The memory circuit of claim 1, further including a gate element coupled between said composite rectifying charge storage device and said word line.

13. The memory circuit of claim 12, wherein said gate element comprises a gate transistor.

14. The memory circuit of claim 12, wherein said gate element comprises a field effect transistor.

15. The memory circuit of claim 1, further including a gate transistor having a gate junction coupled to said word line, and source and drain junctions coupled between said bit line and said composite rectifying charge storage device.

16. The memory circuit of claim 15, wherein said capacitor component comprises said common conductor, a second conductor, and a dielectric material disposed therebetween, said source and drain junctions of said gate transistor being coupled between said bit line and said second conductor, said rectifier component being coupled to ground.

17. The memory circuit of claim 1, further including a gate element coupled between said composite rectifying charge storage device and said word line, and a RAM enable element coupled to said composite rectifying charge storage device for selectively setting said rectifier component in a selected one of substantially conductive and substantially nonconductive states.

18. The memory circuit of claim 17, wherein said gate element comprises a gate transistor, and wherein said RAM enable element comprises a RAM enable transistor.

19. The memory circuit of claim 17, wherein said rectifier component comprises an irreversible state diode component.

20. The memory circuit of claim 17, wherein said rectifier component comprises a reversible state diode component.

21. The memory circuit of claim 1, wherein said rectifier and capacitor components are carried on a common substrate.

22. The memory circuit of claim 21, wherein said common substrate is a flexible substrate.

23. The memory circuit of claim 21, wherein said capacitor structure incorporates said common substrate.

24. The memory circuit of claim 1, further including a gate transistor fabricated as a single unitary structure with said composite rectifying charge storage device.

25. The memory circuit of claim 24, further including a RAM enable transistor fabricated as a single unitary structure with said composite rectifying charge storage device and said gate transistor.

26. The memory circuit of claim 1, further including a RAM enable transistor fabricated as a single unitary structure with said composite rectifying charge storage device.

27. A memory circuit, comprising;
a matrix of memory cells each coupled to and separately addressable by a corresponding one of a plurality of word lines and a corresponding one of a plurality of bit lines; and
a plurality of composite rectifying charge storage devices each disposed within a respective one of said memory cells and coupled between the word line and bit line associated with said one of said memory cells;
each of said composite rectifying charge storage devices comprising a rectifier component fabricated with a common conductor forming a side of the rectifier component, and a capacitor component fabricated as a single unitary structure with the rectifier component such that the capacitor component incorporates the common conductor of the rectifier component as a side of the capacitor component, the capacitor component to receive rectified current from the rectifier component over the common conductor.

28. The memory circuit of claim 27, wherein each of said memory cells further includes a gate element coupled between said composite rectifying charge storage device and said word line, and a RAM enable element coupled to said composite rectifying charge storage device for selectively setting said rectifier component in a selected one of substantially conductive and substantially nonconductive states.

29. The memory circuit of claim 28, wherein said gate element comprises a gate transistor, and wherein said RAM enable element comprises a RAM enable transistor.

30. The memory circuit of claim 28, wherein said rectifier component comprises an irreversible state diode component.

31. The memory circuit of claim 28, wherein said rectifier component comprises a reversible state diode component.

32. The memory circuit of claim 29, wherein said gate transistor of each of said memory cells is fabricated as a single unitary structure with the associated composite rectifying charge storage device.

33. The memory circuit of claim 32, further wherein the RAM enable transistor of each of said memory cells is fabricated as a single unitary structure with the associated composite rectifying charge storage device.

* * * * *